(12) United States Patent
Matsui et al.

(10) Patent No.: US 9,193,904 B2
(45) Date of Patent: Nov. 24, 2015

(54) ETCHANT COMPOSITION AND ETCHING METHOD

(75) Inventors: Atsushi Matsui, Taki-gun Mie (JP);
Mayumi Kimura, Matsuzaka (JP);
Tsuguhiro Tago, Osaka (JP)

(73) Assignee: HAYASHI PURE CHEMICAL IND., LTD., Osaka (JP)

( * ) Notice: Subject to any disclaimer, the term of this patent is extended or adjusted under 35 U.S.C. 154(b) by 0 days.

(21) Appl. No.: 14/240,931

(22) PCT Filed: Aug. 17, 2012

(86) PCT No.: PCT/JP2012/070895
§ 371 (c)(1),
(2), (4) Date: Feb. 25, 2014

(87) PCT Pub. No.: WO2013/031554
PCT Pub. Date: Mar. 7, 2013

(65) Prior Publication Data
US 2014/0235064 A1    Aug. 21, 2014

(30) Foreign Application Priority Data
Aug. 31, 2011 (JP) .................. 2011-189633

(51) Int. Cl.
| C03C 15/00 | (2006.01) |
| C09K 13/08 | (2006.01) |
| H01L 21/311 | (2006.01) |
| C09K 13/06 | (2006.01) |
| H01L 21/306 | (2006.01) |
| C09K 13/00 | (2006.01) |

(52) U.S. Cl.
CPC .............. *C09K 13/08* (2013.01); *C09K 13/00* (2013.01); *C09K 13/06* (2013.01); *H01L 21/30604* (2013.01); *H01L 21/31111* (2013.01); *H01L 21/31144* (2013.01)

(58) Field of Classification Search
CPC ........ C09K 13/00; C09K 13/06; C09K 13/08; H01L 21/3205
USPC ............ 252/79.1–79.4; 438/3, 664, 694, 547; 216/37, 83

See application file for complete search history.

(56) References Cited

U.S. PATENT DOCUMENTS

| 5,700,740 A * | 12/1997 | Chen et al. ..................... 438/710 |
| 6,117,796 A * | 9/2000 | Gale et al. ..................... 438/756 |
| 7,960,328 B2 * | 6/2011 | Visintin et al. ................. 510/175 |
| 2010/0112728 A1 * | 5/2010 | Korzenski et al. ................. 438/3 |

FOREIGN PATENT DOCUMENTS

| JP | 4984372 A | 8/1974 |
| JP | 52-108351 | 9/1977 |
| JP | 59-184532 A | 10/1984 |
| JP | 2000-160367 A | 6/2000 |
| JP | 2000-164585 A | 6/2000 |

(Continued)

*Primary Examiner* — Duy Deo
*Assistant Examiner* — Maki Angadi
(74) *Attorney, Agent, or Firm* — Ditthavong & Steiner, P.C.

(57) ABSTRACT

This invention is concerning an etchant composition used to etch a silicon-containing film formed on a target substrate. The etchant composition includes at least one selected from the group consisting of an organic compound containing a hydroxyl group, an organic compound containing a carbonyl group, an inorganic acid and inorganic salt, hydrofluoric acid, ammonium fluoride and an organic acid.

12 Claims, 1 Drawing Sheet

(56) References Cited

FOREIGN PATENT DOCUMENTS

| | | |
|---|---|---|
| JP | 3292108 B2 | 3/2002 |
| JP | 2004-140197 A | 5/2004 |
| JP | 2004-528716 A | 9/2004 |
| JP | 2006-098421 A | 4/2006 |
| JP | 2008-053723 A | 3/2008 |
| JP | 4397889 B2 | 1/2010 |
| WO | 2010/039936 A2 | 4/2010 |

* cited by examiner

ETCHANT COMPOSITION AND ETCHING METHOD

TECHNICAL FIELD

This invention relates to etchant compositions and etching methods, and more particularly to an etchant composition used in an etching process for fabricating semiconductor devices and the etching method.

BACKGROUND ART

Fabrication processes of semiconductor devices, typified by LSI (Large Scale Integrated circuits) and MOS (Metal Oxide Semiconductor) transistors, include an etching process for removing an insulating film, which is a silicon-containing film such as a silicon oxide film ($SiO_2$), formed over a silicon substrate. The etching process is a process, for example, for partially removing the insulating film over the silicon substrate to obtain a desired pattern. In some cases, an aluminum (Al) film or an alloy film of aluminum and other kinds of metal, which will serve as a wiring layer, is formed over a target substrate, and the etching process is performed on the substrate with both the metal film and silicon oxide film exposed.

One of the etching techniques for removing the insulating film is wet etching in which a silicon substrate to be treated is immersed in an etching solution for a predetermined period of time. A typical etching solution required for wet etching contains hydrofluoric acid, ammonium fluoride and water. However, this type of etching solution lacks an adequate property to prevent corrosion of metal films, such as aluminum film and aluminum alloy film. More specifically speaking, the etching solution strips off a large part of the metal film, or the aluminum film, in a short time at an early stage of the etching process.

Techniques concerning the wet etching of insulating films are disclosed in Japanese Unexamined Patent Application Publication Nos. S49(1974)-84372 (PTL1) and S59(1984)-184532 (PTL2), Japanese Patent No. 4397899 (PTL3), Japanese Unexamined Patent Application Publication No. S52(1977)-108351 (PTL4) and Japanese Patent No. 3292108 (PTL5). PTL1 to PTL3 introduce a mixed solution of hydrofluoric acid, ammonium fluoride and acetic acid for etching. According to PTL4 and PTL5, etching processes are performed with a mixed solution of hydrofluoric acid, ammonium fluoride and polyalcohol.

CITATION LIST

Patent Literature

PTL1: Japanese Unexamined Patent Application Publication No. S49(1974)-84372
PTL2: Japanese Unexamined Patent Application Publication No. S59(1984)-184532
PTL3: Japanese Patent No. 4397899
PTL4: Japanese Unexamined Patent Application Publication No. S52(1977)-108351
PTL5: Japanese Patent No. 3292108

SUMMARY OF INVENTION

Technical Problem

Recent demands on the fabrication processes of semiconductor devices reveal that the etching solutions disclosed in PTL1 to PTL3 have an inadequate property to prevent corrosion of aluminum films and aluminum alloy films. On the other hand, the etching solutions disclosed in PTL 4 and PTL5 have low etch rates, in other words, the etching solutions remove silicon oxide films or other types of films at a low speed, which is unsatisfactory in terms of throughput.

In addition, there is a growing need for an improved selectivity ratio, which is a ratio of the etch rate of insulating films or the like to the etch rate of metal films. That is, the etching solution with a lower selectivity ratio increases the amount of the formed metal film etched, resulting in deterioration in properties of the metal film. To prevent property deterioration there are some countermeasures: for example, formation of the metal film after the etching step of the silicon oxide film; and addition of a step for forming a protective film on the metal film. However, addition of fabrication steps and constraint of fabrication step order are not desirable for maintaining the flexibility of the fabrication steps of semiconductor devices and improving the throughput.

An object of the present invention is to provide an etchant composition with an excellent property to prevent corrosion of metal films and a high etch rate and a high selectivity ratio to perform an etching process in an efficient manner.

Another object of the present invention is to provide an etching method for performing an etching process in an efficient manner.

Solution to Problem

The inventors of the present invention made a thorough study about the components of the etchant composition to solve the aforementioned problems and discovered an etchant composition with an excellent property to prevent corrosion of metal films and a high etch rate and selectivity ratio to perform an etching process in an efficient manner.

The etchant, composition according to the present invention is used to etch a silicon-containing film formed on a target substrate and includes at least one selected from the group consisting of an organic compound containing a hydroxyl group, an organic compound containing a carbonyl group, an inorganic acid and inorganic salt, hydrofluoric acid, ammonium fluoride, and an organic acid.

The etchant composition has an excellent property to prevent corrosion of metal films. In addition, the etchant composition can etch the silicon-containing film formed on the target substrate at a high etch rate and at a high selectivity ratio, which is a ratio of the etch rate of the silicon-containing film to the etch rate of the metal film. Therefore, the use of such an etchant composition allows efficient etching of the films.

The etchant composition described herein indicates the components of an etching solution except for water. That is, the etching solution is made by adding water, which is the rest of the etching solution ingredients, into the etchant composition and is used to etch a target substrate immersed therein. In this description, the compound selected from the group consisting of the organic compound containing a hydroxyl group, organic compound containing a carbonyl group, inorganic acid and inorganic salt may be referred to as an additive.

Preferably, the etchant composition includes a surfactant. The etchant composition containing a surfactant improves so-called wettability between the etching solution and an object to be etched, thereby efficiently etching the object.

The organic acid herein preferably includes at least one selected from the group consisting of monocarboxylic acid, polycarboxylic acid, oxycarboxylic acid, phosphonic acid and sulfonic acid.

More specifically, the organic acid preferably includes at least one selected from the group consisting of acetic acid, propionic acid, oxalic acid, malonic acid, succinic acid, glutaric acid, glycolic acid, lactic acid, malic acid, tartaric acid, citric acid, amino tris(methylenephosphonic acid), 1-hydroxyethylidene-1,1-diphosphonic acid, methanesulfonic acid and ethanesulfonic acid.

The organic compound containing a hydroxyl group preferably includes at least one selected from the group consisting of alcohols, glycols, triols and methylols.

More specifically, the organic compound containing a hydroxyl group preferably includes at least one selected from the group consisting of furfuryl alcohol, propylene glycol, polyethylene glycol, 1,4-butanediol, 3-methyl-1,3-butanediol, 1,6-hexanediol, 1,8-octanediol, 1,3-cyclohexanediol, 1,4-cyclohexanediol, 1,2,4-butanetriol, 3-methylpentane-1,3,5-triol and 1,4-cyclohexanedimethanol.

The organic compound containing a carbonyl group preferably includes at least one selected from the group consisting of ketones, aldehydes and esters.

More specifically, the organic compound containing a carbonyl group preferably includes at least one selected from the group consisting of cyclopentanone and cyclohexanone.

The inorganic acid preferably includes at least one selected from the group consisting of nitric acid, sulfuric acid and sulfamic acid.

The inorganic salt preferably includes at least one selected from the group consisting of ammonium nitrate, ammonium sulfate and ammonium sulfamate.

The surfactant preferably includes at least one selected from the group consisting of an amphoteric surfactant, an anionic surfactant and a nonionic surfactant.

Another aspect of the present invention is directed to an etching method used to etch a silicon-containing film formed on a target substrate. The etching method for etching the substrate uses an etchant composition including at least one selected from the group consisting of an organic compound containing a hydroxyl group, an organic compound containing a carbonyl group, an inorganic acid and inorganic salt, hydrofluoric acid, ammonium fluoride and an organic acid.

With this etching method, etching can be done in an efficient manner.

Advantageous Effects of Invention

The etchant composition described above has an excellent property to prevent corrosion of metal films. In addition, the etchant composition can etch the silicon-containing film formed on the target substrate at a high etch rate and at a high selectivity ratio, which is a ratio of the etch rate of the silicon-containing film to the etch rate of the metal film. Therefore, the use of such an etchant composition allows efficient etching of the film.

According to the etching method, etching can be done in an efficient manner.

DESCRIPTION OF EMBODIMENT

Figure 1:
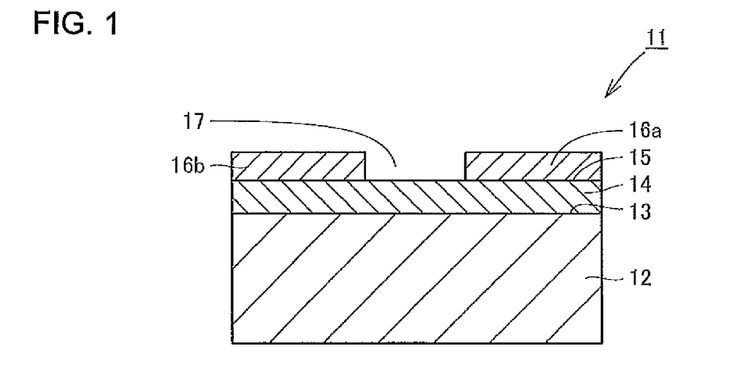
FIG. 1 is a schematic cross-sectional view partially showing a target substrate before etching.

With reference to the drawings, an embodiment of the present invention will be described below. FIG. 1 is a schematic cross-sectional view partially showing a target substrate before etching with an etchant composition according to the invention. Referring to FIG. 1, the target substrate 11 is composed of a base silicon substrate 12 and an insulating film 14 formed on the entire surface 13 of the substrate 12. The insulating film 14 is a film containing silicon, and the typical material is a silicon oxide film ($SiO_2$). The insulating film 14 is shaped, or formed, by, for example, CVD (Chemical Vapor Deposition) or sputtering. There are various film-forming methods: for example, a method of forming the silicon oxide film under a high temperature environment; and a method of forming the silicon oxide film by plasma processing with TEOS (Tetraethoxysilane) gas as a reactant gas. Among those, a method is employed according to the requirements.

On a surface 15 of the insulating film 14, conductive layers, or metal films 16a, 16b serving as wires, are formed in a predetermined pattern. Specifically, the metal film 16a is formed on the right side of FIG. 1 and the metal film 16b is formed on the left side of FIG. 1 with an opening 17 provided therebetween. The material of the metal films 16a, 16b may be, for example, aluminum (Al).

The target substrate 11 undergoes an etching process using the etchant composition of the present invention. The etching performed herein is wet etching.

Figure 2:
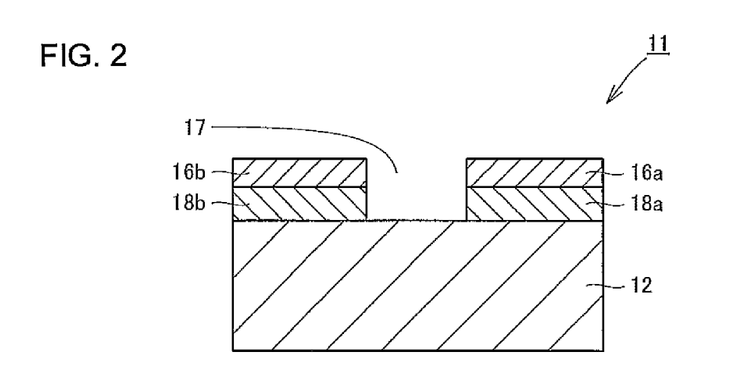
FIG. 2 is a schematic cross-sectional view partially showing the target substrate after etching.

FIG. 2 is a schematic cross-sectional view partially showing the target substrate after etching with the etchant composition of the invention and corresponding to the cross-sectional view of FIG. 1. Referring to FIGS. 1, 2, the insulating film 14 only under the opening 17 shown in FIG. 1 is removed by wet etching.

Although it is not illustrated in the drawings, the etchant composition of the invention can be used for the substrate with a resist film formed thereon. Prior to etching, a photoresist film layer is sometimes formed on an insulating film, or a silicon oxide film, on a metal film. The etchant composition is effectively used to etch the target substrate after the resist film has been formed.

The etchant composition of the invention is used to etch silicon-containing films formed on the target substrate and includes at least one selected from the group consisting of an organic compound containing a hydroxyl group, an organic compound containing a carbonyl group, an inorganic acid and inorganic salt, in addition to hydrofluoric acid, ammonium fluoride and an organic acid.

The etchant composition containing the above components has an excellent property to prevent corrosion of metal films. In addition, the etchant composition has a high etch rate of the silicon-containing film formed on the target substrate and a high selectivity ratio of the etch rate of the silicon-containing film to the etch rate of the metal film. Therefore, etching can be done in an efficient manner with the etchant composition.

An etching method used herein is dip etching or spray etching. In dip etching, the target substrate is directly immersed in an etching solution having the aforementioned etchant composition, and the target substrate is left standing or shaken in the etching solution, or the etching solution is agitated. In spraying etching, an etching solution is applied to the target substrate through a spray nozzle.

The concentration of hydrofluoric acid (HF) contained in the etchant composition of the invention is appropriately determined based on the composition of the silicon-containing film to be etched, the material of the metal film to be etched and other factors. A preferable concentration of hydrofluoric acid (HF) in the entire etching solution may range approximately from 0.5 weight % to 15 weight %, and more preferably from 1.5 weight % to 10 weight %.

The concentration of ammonium fluoride (NH$_4$F) contained in the etchant composition of the invention is appropriately determined based on the composition of the silicon-containing film to be etched, the material of the metal film to be etched and other factors. A preferable concentration of ammonium fluoride (NH$_4$F) in the entire etching solution may range approximately from 5 weight % to 30 weight %, and more preferably from 10 weight % to 25 weight %.

The concentration of organic acid contained in the etchant composition of the invention is appropriately determined based on the composition of the silicon-containing film to be etched, the material of the metal film to be etched and other factors. A preferable concentration of organic acid in the entire etching solution may range approximately from 5 weight % to 70 weight %, and more preferably from 15 weight % to 60 weight %.

The concentration of additives contained in the etchant composition of the invention is appropriately determined based on the composition of the silicon-containing film to be etched, the material of the metal film to be etched and other factors. A preferable concentration of additives in the entire etching solution may range approximately from 1 weight % to 70 weight %, and more preferably from 5 weight % to 40 weight %.

The organic acid contained in the etchant composition of the invention preferably includes at least one selected from the group consisting of monocarboxylic acid, polycarboxylic acid, oxycarboxylic acid, phosphonic acid and sulfonic acid. More specifically, the organic acid preferably includes at least one selected from the group consisting of acetic acid, propionic acid, oxalic acid, malonic acid, succinic acid, glutaric acid, glycolic acid, lactic acid, malic acid, tartaric acid, citric acid, amino tris(methylenephosphonic acid), 1-hydroxyethylidene-1,1-diphosphonic acid, methanesulfonic acid and ethanesulfonic acid. The etchant composition may include two or more of the above mentioned organic acids.

The organic compound containing a hydroxyl group contained in the etchant composition of the invention preferably includes at least one selected from the group consisting of alcohols, glycols, triols and methylols. More specifically, the organic compound containing a hydroxyl group preferably includes at least one selected from the group consisting of furfuryl alcohol, propylene glycol, polyethylene glycol, 1,4-butanediol, 3-methyl-1,3-butanediol, 1,6-hexanediol, 1,8-octanediol, 1,3-cyclohexanediol, 1,4-cyclohexanediol, 1,2,4-butanetriol, 3-methylpentane-1,3,5-triol and 1,4-cyclohexanedimethanol. The etchant composition may include two or more of the above mentioned organic compounds containing a hydroxy group.

The organic compound containing a carbonyl group contained in the etchant composition of the invention preferably includes at least one selected from the group consisting of ketones, aldehydes and esters. More specifically, the organic compound containing a carbonyl group preferably includes at least one selected from the group consisting of cyclopentanone and cyclohexanone. The etchant composition may include two or more of the above mentioned organic compounds containing a carbonyl group.

The inorganic acid contained in the etchant composition of the invention preferably includes at least one selected from the group consisting of nitric acid, sulfuric acid and sulfamic acid. The etchant composition may include two or more of the above mentioned inorganic acids.

The inorganic salt contained in the etchant composition of the invention preferably includes at least one selected from the group consisting of ammonium nitrate, ammonium sulfate and ammonium sulfamate. The etchant composition may include two or more of the above mentioned inorganic salts.

The surfactant contained in the etchant composition of the invention preferably includes at least one selected from the group consisting of an amphoteric surfactant, an anionic surfactant and a nonionic surfactant. The etchant composition may include two or more of the above mentioned surfactants.

The silicon-containing film to be etched may be a thermally-oxidized film, which is a silicon oxide film formed in the aforementioned high-temperature environment or a P-TEOS film, which is a silicon oxide film formed by plasma processing using a TEOS reactant gas; however, the present invention does not limit the silicon-containing film to the two above-mentioned films, and an LP-TEOS (Low-Pressure TEOS) film, a SOG (Spin On Glass) film, an NSG (Non Doped Silicate Glass) film, a BSG (Boro Silicate Glass) film, a PSG (Phospho Silicate Glass) film, a BPSG (Boro Phospho Silicate Glass) film, a SiN film and other types of films are also available.

EXAMPLES

The present invention will now be further specifically described by the following examples with the understanding that the invention is not limited by the examples.

Tables 1, 2, 3, 4, 5 and 6 show the components of the etchant compositions and the evaluation results of Examples 1 to 24 and Comparative Examples 1 to 7. In addition to hydrofluoric acid, ammonium fluoride, an organic acid and a surfactant, the tables indicate compounds selected from the group consisting of an organic compound containing a hydroxyl group, an organic compound containing a carbonyl group, an inorganic acid and inorganic salt, as additives. Note that in the tables the absence of an additive is expressed by "–", the content of the compounds is expressed in the unit weight %, and the compounds are abbreviated as follows.

MSA: methanesulfonic acid
PG: propylene glycol
1,4-BD: 1,4-butanediol
1,6-HD: 1,6-hexanediol
1,3-CHD: 1,3-cyclohexanediol
3-MP-1,3,5-TO: 3-methylpentane-1,3,5-triol
FFA: furfuryl alcohol
PEG: polyethylene glycol
F series-1: α-perfluorononenyloxy-ω-methyl-polyethylene oxide
F series-2: perfluoroalkylamine oxide
F series-3: perfluoroalkyl sulfonic acid The surfactant of F series-1 (α-perfluorononenyloxy-ω-methyl-polyethylene oxide) is a nonionic surfactant, the surfactant of F series-2 (perfluoroalkylamine oxide) is an amphoteric surfactant, and the surfactant of F series-3 (perfluoroalkyl sulfonic acid) is an anionic surfactant.

The component of the etching solution, other than the etchant composition including hydrofluoric acid, ammonium fluoride, organic acid, an additive and a surfactant, is water. Explaining the components of the etchant compositions by taking the examples, the etchant composition of Example 1 includes 2.5 weight % hydrofluoric acid, 20 weight % ammonium fluoride, 35 weight % acetic acid as an organic acid and 10 weight % 1,4-butanediol as an organic compound additive containing a hydroxyl group. Adding 32.5 weight % water, the remaining percentage of the resultant etching solution, to the etchant composition completes an etching solution. In this case, the etchant composition of Example 1 consists of hydrofluoric acid, ammonium fluoride, acetic acid as an organic acid and 1,4-butanediol as an organic compound containing a hydroxyl group. The etching solution of Example 1 consists of hydrofluoric acid, ammonium fluoride, acetic acid as an organic acid, 1,4-butanediol as an organic compound containing a hydroxyl group and water. As another example, the etchant composition of Example 22 consists of hydrofluoric acid, ammonium fluoride, acetic acid, 1,4-butanediol as an organic acid and α-perfluorononenyloxy-ω-methyl-polyethylene oxide as a surfactant. The etching solution of Example 22 consists of hydrofluoric acid, ammonium fluoride, acetic acid, 1,4-butanediol as an organic acid, α-perfluorononenyloxy-ω-methyl-polyethylene oxide as a surfactant and water.

When preparing the etchant composition, the hydrofluoric acid is combined in a form of an aqueous solution containing 40 to 50 weight % hydrofluoric acid. The content of hydrofluoric acid shown in Table 1 is expressed in terms of HF. The other compounds are expressed in the same manner.

In the tables, "th-SiO$_2$" denotes a silicon oxide film formed by thermal oxidation under a high temperature environment, "P-TEOS" denotes a silicon oxide film formed by plasma processing with a TEOS reactant gas, and "P-SiN" denotes a silicon nitride film formed by plasma processing. These films are different in density and some other characteristics due to their different fabrication methods or film-forming methods. Accordingly, the films have different etch rates and other characteristics; however, the films of every example and comparative example exhibit the same tendencies.

The evaluation results have been obtained through the following method.

(Measurement of Etch Rate)

The etch rates of the aforementioned films were measured. Measurement was made with each of the films immersed in etching solutions that have the compositions shown in the tables and were kept at a temperature of 25° C. for any of three lengths of time. After being immersed in the etching solutions, the target substrates were rinsed with water and dried. Then, the amounts of the films etched were measured and the etch rates were obtained from the measured amounts of the films etched and the time taken to etch the films. The amounts of the films etched were obtained by measuring the thicknesses of the films before and after immersion in the etching solutions by an interference thickness meter and calculating the difference between the thicknesses.

(Evaluation of Corrosivity)

Corrosivity of aluminum films and aluminum-copper alloy films was evaluated. In some cases of aluminum films and alloy films of aluminum and other kinds of metal, etching nearly stops after an elapse of a certain time period from the start of etching. Therefore, the aluminum films and aluminum-copper alloy films were evaluated for their corrosivity.

To evaluate the corrosivity, the amounts of an aluminum film and an aluminum-copper alloy film etched for one minute after the start of etching were measured and the measured etched amounts served as evaluation indices. The measurement method of the amount of the aluminum film etched includes immersing an aluminum film formed on a target substrate in an etching solution for one minute, rinsing the target substrate with water after one-minute immersion, drying the target substrate, and measuring the etched amount. The etched amount was obtained by measuring the thickness of the aluminum film before and after the immersion by a 4-pin probe resistivity meter, and then calculating the difference between the thicknesses. The calculated values are shown in the tables as results of "one-minute etching".

Based on the values obtained from the one-minute etching, the selectivity ratio of each film to the aluminum film was calculated. The equation below was used to determine the selectivity ratio.

Selectivity ratio=etch rate of silicon oxide film or silicon nitride film/amount of aluminum film etched within one minute The amounts of alloy films of aluminum and copper (aluminum-copper alloy film) etched were also measured through the same processes to determine the selectivity ratios. The selectivity ratios of the alloy films can be calculated by substituting the amount of the aluminum-copper alloy film etched for one minute for the amount of the aluminum film etched for one minute.

Since the etch rate of the silicon oxide film, the etch rate of the silicon nitride film and the amount of the aluminum film etched for one minute are expressed in the unit Å (angstrom)/minute, the selectivity ratio is not expressed in any particular unit of measure. In this description, the selectivity ratio represents the amount of the silicon oxide film or silicon nitride film etched relative to the amount of the aluminum film etched for one minute from the start of etching, and the higher selectivity ratio demonstrates that the etching solution is superior. This can be applied to the case of the aluminum-copper alloy films.

(Evaluation of Removability of Natural Oxide Film and Removability of Damaged Silicon Layer)

One of the steps of fabricating semiconductor devices is anisotropic etching of monocrystalline silicon. To perform the monocrystalline-silicon anisotropic etching step, a natural oxide film, which is formed in the surface-layer of monocrystalline silicon, and a damaged layer, which is formed in the surface-layer of monocrystalline silicon due to dry etching performed to etch an insulating film formed on the top of the monocrystalline silicon, need to be removed before the anisotropic etching step. The natural oxide film in the surface-layer of the monocrystalline silicon and the damaged layer conventionally have been removed with buffered hydrofluoric acid, which is an etching solution containing hydrofluoric acid, ammonium fluoride and water.

However, as described above, the buffered hydrofluoric acid including hydrofluoric acid, ammonium fluoride and water has some problems in terms of the property to prevent corrosion of the aluminum films and aluminum alloy films. Therefore, required in the process of fabricating the semiconductor devices is a solution having a good property to prevent corrosion of metal films and being capable of removing the natural oxide films. If there is a pretreatment liquid to be used before anisotropic etching, a step of forming a protective film for an aluminum film conventionally required when using the buffered hydrofluoric acid can be omitted, thereby improving throughput in the fabrication steps of the semiconductor device.

Evaluation was made to determine whether the etchant composition of the invention can remove the natural oxide films and damaged layers as pretreatment for anisotropic etching.

Specifically, target substrates to be subjected to silicon anisotropic etching were prepared and then were immersed in etching solutions according to the examples and the comparative examples for 3.5 minutes. The temperature of the etching solutions was set to 25° C. After immersion, the target substrates were rinsed with water, dried and underwent silicon anisotropic etching, and then were examined whether etching had proceeded or not. In the tables, the results are shown under an item name, simply shown as "removability of natural oxide film".

(Evaluation of Resist Damage)

In some cases, etching is performed after resist formation. In the aforementioned cases, the etchant composition should be less damaging to the resist. Evaluation of damage to the resist was made as follows. On a bare silicon substrate, which was, in other words, a raw silicon substrate with no layers formed thereon, formed was a novolac-based positive resist layer. Specifically, after being applied with a resist, the substrate was exposed to light, then developed, and baked to form a positive resist. Subsequently, the substrate with the positive resist layer was immersed in an etching solution for 30 minutes. The temperature of the etching solution was set to 25° C. After 30-minute immersion, the substrate was rinsed with water and dried, and the surface of the positive resist layer was observed. The surface observation of the positive resist layer was made with an optical microscope. If there was no change in the positive resist layer, the etching solution used was evaluated as "good", while if there was elusion or exfoliation in the positive resist layer, the etching solution used was evaluated as "poor".

(Evaluation of Etch Rate of Each Metal Film)

The etch rates of copper (Cu), nickel (Ni), chromium (Cr), molybdenum (Mo), tungsten (W), tantalum (Ta), gold (Au) were measured through the following steps. A metal film of each of the above materials was formed on a target substrate that was then immersed in an etching solution at a temperature of 25° C. for 15 minutes and 30 minutes. The target substrate was rinsed with water and dried after each immersion duration time to measure the amount of the metal film etched. From the measurement results, the etch rate was calculated. The amount of the film etched was obtained by measuring the thicknesses of the metal film before and after the immersion by a 4-pin probe resistivity meter and calculating the difference between the thicknesses. If the measured etched amount was equal to or lower than the measurement error range of the 4-pin probe resistivity meter; the etched amount was determined to be the lower limit value or lower obtained from the measurement error.

The evaluation results of the etch rates of the metal layers were almost the same in all the examples and comparative examples. Specifically, the etch rate of copper was 3 (Å/minute) or lower, nickel was 3 (Å/minute) or lower, chromium was 5 (Å/minute) or lower, molybdenum was 3 (Å/minute) or lower, tungsten was 5 (Å/minute) or lower, tantalum was 3 (Å/minute) or lower, and gold was 3 (Å/minute) or lower. Note that the evaluation results concerning the etch rate of each metal film were not shown in the tables.

TABLE 1

| | HYDRO-FLUORIC ACID (WEIGHT %) | AMMONIUM FLUORIDE (WEIGHT %) | ORGANIC ACID TYPE | ORGANIC ACID CONTENT (WEIGHT %) | ADDITIVE TYPE | ADDITIVE CONTENT (WEIGHT %) | SURFACTANT TYPE | SURFACTANT CONTENT (WEIGHT %) | WATER (WEIGHT %) |
|---|---|---|---|---|---|---|---|---|---|
| EXAMPLE 1 | 2.5 | 20 | ACETIC ACID | 35 | 1,4-BD | 10 | — | 0 | 32.5 |
| EXAMPLE 2 | 1.5 | 20 | ACETIC ACID | 35 | 1,4-BD | 10 | — | 0 | 33.5 |
| EXAMPLE 3 | 4.5 | 20 | ACETIC ACID | 35 | 1,4-BD | 10 | — | 0 | 30.5 |
| EXAMPLE 4 | 10 | 15 | ACETIC ACID | 35 | 1,4-BD | 10 | — | 0 | 30 |
| EXAMPLE 5 | 1.5 | 25 | ACETIC ACID | 35 | 1,4-BD | 10 | — | 0 | 28.5 |
| EXAMPLE 6 | 2.5 | 10 | ACETIC ACID | 60 | 1,4-BD | 10 | — | 0 | 17.5 |
| EXAMPLE 7 | 2.5 | 20 | ACETIC ACID | 35 | 1,4-BD | 5 | — | 0 | 37.5 |
| EXAMPLE 8 | 2.5 | 15 | ACETIC ACID | 15 | 1,4-BD | 40 | — | 0 | 27.5 |
| EXAMPLE 9 | 3.5 | 20 | LACTIC ACID | 31.1 | 1,4-BD | 7.6 | — | 0 | 37.8 |
| EXAMPLE 10 | 1.5 | 15 | LACTIC ACID | 45.8 | 1,4-BD | 7.6 | — | 0 | 30.1 |
| EXAMPLE 11 | 1.5 | 15 | ACETIC ACID MSA | 44.2 7.6 | 1,4-BD | 7.6 | — | 0 | 24.1 |
| EXAMPLE 12 | 3.5 | 20 | ACETIC ACID | 35 | 1,6-HD | 7.6 | — | 0 | 33.9 |

TABLE 2

| | HYDRO-FLUORIC ACID (WEIGHT %) | AMMONIUM FLUORIDE (WEIGHT %) | ORGANIC ACID TYPE | ORGANIC ACID CONTENT (WEIGHT %) | ADDITIVE TYPE | ADDITIVE CONTENT (WEIGHT %) | SURFACTANT TYPE | SURFACTANT CONTENT (WEIGHT %) | WATER (WEIGHT %) |
|---|---|---|---|---|---|---|---|---|---|
| EXAMPLE 13 | 1.5 | 15 | ACETIC ACID | 51.8 | 1,6-HD | 7.6 | — | 0 | 24.1 |
| EXAMPLE 14 | 3.5 | 20 | ACETIC ACID | 35 | 1,3-CHD | 7.6 | — | 0 | 33.9 |
| EXAMPLE 15 | 3.5 | 20 | LACTIC ACID | 31.1 | 3-MP-1,3,5-TO | 7.6 | — | 0 | 37.8 |
| EXAMPLE 16 | 1.5 | 15 | ACETIC ACID | 51.8 | FFA | 7.6 | — | 0 | 24.1 |
| EXAMPLE 17 | 1.5 | 15 | ACETIC ACID | 51.8 | PG | 7.6 | — | 0 | 24.1 |
| EXAMPLE 18 | 3.5 | 20 | ACETIC ACID | 35 | PEG | 7.6 | — | 0 | 33.9 |
| EXAMPLE 19 | 3.5 | 20 | ACETIC ACID | 35 | CYCLOPENTANONE | 7.6 | — | 0 | 33.9 |
| EXAMPLE 20 | 1.5 | 15 | ACETIC ACID | 51.8 | SULFAMIC ACID | 7.6 | — | 0 | 24.1 |

TABLE 2-continued

| | HYDRO-FLUORIC ACID (WEIGHT %) | AMMONIUM FLUORIDE (WEIGHT %) | ORGANIC ACID TYPE | CONTENT (WEIGHT %) | ADDITIVE TYPE | CONTENT (WEIGHT %) | SURFACTANT TYPE | CONTENT (WEIGHT %) | WATER (WEIGHT %) |
|---|---|---|---|---|---|---|---|---|---|
| EXAMPLE 21 | 1.5 | 15 | LACTIC ACID | 45.8 | AMMONIUM NITRATE | 7.6 | — | 0 | 30.1 |
| EXAMPLE 22 | 3.5 | 20 | ACETIC ACID | 35 | 1,4-BD | 7.6 | F SERIES-1 | 0.01 | 33.89 |
| EXAMPLE 23 | 3.5 | 20 | ACETIC ACID | 35 | 1,4-BD | 7.6 | F SERIES-2 | 0.001 | 33.899 |
| EXAMPLE 24 | 3.5 | 20 | ACETIC ACID | 35 | 1,4-BD | 7.6 | F SERIES-3 | 0.001 | 33.899 |

TABLE 3

| | HYDRO-FLUORIC ACID (WEIGHT %) | AMMONIUM FLUORIDE (WEIGHT %) | ORGANIC ACID TYPE | CONTENT (WEIGHT %) | ADDITIVE TYPE | CONTENT (WEIGHT %) | SURFACTANT TYPE | CONTENT (WEIGHT %) | WATER (WEIGHT %) |
|---|---|---|---|---|---|---|---|---|---|
| COMPARATIVE EXAMPLE 1 | 6 | 30 | — | 0 | — | 0 | — | 0 | 64 |
| COMPARATIVE EXAMPLE 2 | 1.5 | 15 | — | 0 | — | 0 | — | 0 | 83.5 |
| COMPARATIVE EXAMPLE 3 | 3.5 | 20 | ACETIC ACID | 42.7 | — | 0 | — | 0 | 33.8 |
| COMPARATIVE EXAMPLE 4 | 3.5 | 20 | LACTIC ACID | 36.9 | — | 0 | — | 0 | 39.6 |
| COMPARATIVE EXAMPLE 5 | 1.5 | 15 | ACETIC ACID | 59.3 | — | 0 | — | 0 | 24.2 |
| COMPARATIVE EXAMPLE 6 | 3.5 | 20 | — | 0 | PG | 42.7 | — | 0 | 33.8 |
| COMPARATIVE EXAMPLE 7 | 1.5 | 15 | — | 0 | 1,4-BD | 24.4 | — | 0 | 59.1 |

TABLE 4

| | ETCH RATE (Å/MINUTE) | | | Al ETCHED AMOUNT(Å) ONE-MINUTE ETCHING | Al SELECTIVITY RATIO | | | AlCu ETCHED AMOUNT(Å) ONE-MINUTE ETCHING | AlCu SELECTIVITY RATIO | | | REMOVABILITY OF NATURAL OXIDE FILM | RESIST DAMAGE |
|---|---|---|---|---|---|---|---|---|---|---|---|---|---|
| | th-SiO$_2$ | P-TEOS | P-SiN | | th-SiO$_2$ | P-TEOS | P-SiN | | th-SiO$_2$ | P-TEOS | P-SiN | | |
| EXAMPLE 1 | 762 | 1888 | 119 | 77 | 9.9 | 24.5 | 1.5 | 125 | 6.1 | 15.1 | 1.0 | GOOD | POOR |
| EXAMPLE 2 | 631 | 1500 | 100 | 55 | 11.5 | 27.3 | 1.8 | 100 | 6.3 | 15.0 | 1.0 | GOOD | POOR |
| EXAMPLE 3 | 1084 | 2610 | 161 | 93 | 11.7 | 28.1 | 1.7 | 130 | 8.3 | 20.1 | 1.2 | GOOD | POOR |
| EXAMPLE 4 | 2380 | 5118 | 322 | 113 | 21.1 | 45.3 | 2.8 | 169 | 14.1 | 30.3 | 1.9 | GOOD | POOR |
| EXAMPLE 5 | 729 | 1626 | 104 | 88 | 8.3 | 18.5 | 1.2 | 108 | 6.8 | 15.1 | 1.0 | GOOD | POOR |
| EXAMPLE 6 | 794 | 2397 | 147 | 84 | 9.5 | 28.5 | 1.8 | 120 | 6.6 | 20.0 | 1.2 | GOOD | POOR |
| EXAMPLE 7 | 811 | 1949 | 127 | 68 | 11.9 | 28.7 | 1.9 | 134 | 6.1 | 14.5 | 0.9 | GOOD | POOR |
| EXAMPLE 8 | 685 | 1519 | 104 | 61 | 11.2 | 24.9 | 1.7 | 108 | 6.3 | 14.1 | 1.0 | GOOD | POOR |
| EXAMPLE 9 | 1176 | 2743 | 185 | 94 | 12.5 | 29.2 | 2.0 | 204 | 5.8 | 13.4 | 0.9 | GOOD | GOOD |
| EXAMPLE 10 | 831 | 2350 | 138 | 97 | 8.6 | 24.2 | 1.4 | 101 | 8.2 | 23.3 | 1.4 | GOOD | GOOD |
| EXAMPLE 11 | 1029 | 2477 | 146 | 102 | 10.1 | 24.3 | 1.4 | 114 | 9.0 | 21.7 | 1.3 | GOOD | POOR |
| EXAMPLE 12 | 1008 | 2393 | 144 | 86 | 11.7 | 27.8 | 1.7 | 147 | 6.9 | 16.3 | 1.0 | GOOD | POOR |

TABLE 5

| | ETCH RATE (Å/MINUTE) | | | Al | | | | AlCu | | | REMOVABILITY OF NATURAL OXIDE FILM | RESIST DAMAGE |
| | | | | ETCHED AMOUNT(Å) | SELECTIVITY RATIO | | | ETCHED AMOUNT(Å) | SELECTIVITY RATIO | | | |
| | th-SiO$_2$ | P-TEOS | P-SiN | ONE-MINUTE ETCHING | th-SiO$_2$ | P-TEOS | P-SiN | ONE-MINUTE ETCHING | th-SiO$_2$ | P-TEOS | P-SiN | | |
|---|---|---|---|---|---|---|---|---|---|---|---|---|---|
| EXAMPLE 13 | 769 | 2161 | 112 | 59 | 13.0 | 36.6 | 1.9 | 84 | 9.2 | 25.7 | 1.3 | GOOD | POOR |
| EXAMPLE 14 | 984 | 2495 | 141 | 85 | 11.6 | 29.4 | 1.7 | 126 | 7.8 | 19.8 | 1.1 | GOOD | POOR |
| EXAMPLE 15 | 986 | 2262 | 140 | 107 | 9.2 | 21.1 | 1.3 | 123 | 8.0 | 18.4 | 1.1 | GOOD | GOOD |
| EXAMPLE 16 | 786 | 1978 | 120 | 103 | 7.6 | 19.2 | 1.2 | 133 | 5.9 | 14.9 | 0.9 | GOOD | POOR |
| EXAMPLE 17 | 686 | 1437 | 94 | 75 | 9.1 | 19.2 | 1.3 | 86 | 8.0 | 16.7 | 1.1 | GOOD | POOR |
| EXAMPLE 18 | 969 | 2228 | 130 | 94 | 10.3 | 23.7 | 1.4 | 133 | 7.3 | 16.8 | 1.0 | GOOD | POOR |
| EXAMPLE 19 | 1001 | 2376 | 148 | 118 | 8.5 | 20.1 | 1.3 | 162 | 6.2 | 14.7 | 0.9 | GOOD | POOR |
| EXAMPLE 20 | 1068 | 2529 | 157 | 103 | 10.4 | 24.6 | 1.5 | 132 | 8.1 | 19.2 | 1.2 | GOOD | POOR |
| EXAMPLE 21 | 767 | 2158 | 143 | 86 | 8.9 | 25.1 | 1.7 | 130 | 5.9 | 16.6 | 1.1 | GOOD | GOOD |
| EXAMPLE 22 | 1029 | 2473 | 145 | 118 | 8.7 | 21.0 | 1.2 | 170 | 6.1 | 14.5 | 0.9 | GOOD | POOR |
| EXAMPLE 23 | 990 | 2357 | 139 | 91 | 10.9 | 25.9 | 1.5 | 159 | 6.2 | 14.8 | 0.9 | GOOD | POOR |
| EXAMPLE 24 | 1011 | 2351 | 143 | 104 | 9.7 | 22.6 | 1.4 | 168 | 6.0 | 14.0 | 0.9 | GOOD | POOR |

TABLE 6

| | ETCH RATE (Å/MINUTE) | | | Al | | | | AlCu | | | | REMOVABILITY OF NATURAL OXIDE FILM | RESIST DAMAGE |
| | | | | ETCHED AMOUNT(Å) | SELECTIVITY RATIO | | | ETCHED AMOUNT(Å) | SELECTIVITY RATIO | | | | |
| | th-SiO$_2$ | P-TEOS | P-SiN | ONE-MINUTE ETCHING | th-SiO$_2$ | P-TEOS | P-SiN | ONE-MINUTE ETCHING | th-SiO$_2$ | P-TEOS | P-SiN | | |
|---|---|---|---|---|---|---|---|---|---|---|---|---|---|
| COMPARATIVE EXAMPLE 1 | 1111 | 2598 | 164 | 299 | 3.7 | 8.7 | 0.5 | 1494 | 0.7 | 1.7 | 0.1 | GOOD | GOOD |
| COMPARATIVE EXAMPLE 2 | 333 | 863 | 84 | 848 | 0.4 | 1.0 | 0.1 | 1747 | 0.2 | 0.5 | 0.0 | POOR | GOOD |
| COMPARATIVE EXAMPLE 3 | 1044 | 2361 | 150 | 194 | 5.4 | 12.2 | 0.8 | 291 | 3.6 | 8.1 | 0.5 | GOOD | POOR |
| COMPARATIVE EXAMPLE 4 | 1187 | 2448 | 173 | 191 | 6.2 | 12.8 | 0.9 | 340 | 3.5 | 7.2 | 0.5 | GOOD | GOOD |
| COMPARATIVE EXAMPLE 5 | 783 | 1887 | 126 | 134 | 5.8 | 14.1 | 0.9 | 167 | 4.7 | 11.3 | 0.8 | GOOD | POOR |
| COMPARATIVE EXAMPLE 6 | 338 | 811 | 72 | 155 | 2.2 | 5.2 | 0.5 | 269 | 1.3 | 3.0 | 0.3 | POOR | GOOD |
| COMPARATIVE EXAMPLE 7 | 294 | 695 | 55 | 216 | 1.4 | 3.2 | 0.3 | 423 | 0.7 | 1.6 | 0.1 | POOR | GOOD |

The etching solutions of Comparative Example 1 and Comparative Example 2 are a kind of generally-used buffered hydrofluoric acid, which includes hydrofluoric acid, ammonium fluoride and water. The etching solutions of Comparative Examples 3, 4 and 5 are buffered hydrofluoric acid with only organic acid added, which includes hydrofluoric acid, ammonium fluoride, organic acid and water. The etching solutions of Comparative Examples 6 and 7 are buffered hydrofluoric acid with only alcohol added, which includes hydrofluoric acid, ammonium fluoride, alcohol and water.

Referring to Tables 1 to 6, the etch rate of the silicon oxide film or silicon nitride film will be described below. Among Examples 1 to 24, Example 2 exhibits the lowest etch rate of 631 (Å/minute) for the thermally-oxidized film (th-SiO$_2$). The other solutions of Examples 1 to 24 etched the thermally-oxidized film at an etch rate of 600 (Å/minute) or higher. On the other hand, the etch rate values of Comparative Examples 2, 6 and 7 are 333 (Å/minute), 338 (Å/minute), 294 (Å/minute), respectively, which are very low. The etching solutions having such low etch rates are not preferable from the viewpoint of throughput. Examples 1 to 24 and Comparative Examples 1 to 7 exhibit similar tendencies for the P-TEOS films and P-SiN films.

A description about corrosivity will be made below. Among Comparative Examples 1 to 7, Comparative Example 5 exhibits an etched amount of 134 (Å), which is the smallest value to remove aluminum by one-minute etching, although the other comparative examples show etched amounts of 150 (Å) or larger. Such large amounts of aluminum etched for one minute imply that the etching solutions have removed a large amount of aluminum film immediately after the start of etching, which is unfavorable in terms of corrosivity. On the other hand, among Examples 1 to 24, the largest amount of aluminum etched for one minute was 118 (Å) by Example 19. The other examples have etched less aluminum than 118 (Å), and it is often the case of less than 100 (Å). Such small amounts of aluminum etched for one minute is preferable in terms of corrosivity. Examples 1 to 24 and Comparative Examples 1 to 7 exhibit similar tendencies for the aluminum-copper alloy films.

The selectivity ratio will be also evaluated as follows. As to Comparative Examples 1 and 2, the aluminum and aluminum-copper alloy film were etched relatively in large amounts, resulting in low selectivity ratios. Specifically, the selectivity ratios of the thermally-oxidized film to the aluminum film are 3.7 in Comparative Example 1 and 0.4 in Comparative Example 2. The selectivity ratios of Comparative Examples 3 to 5 are 5.4, 6.2, and 5.8, respectively, which are higher than those of Comparative Examples 1 and 2; however, those values are still not high enough to satisfy the recent demand for throughput improvement. The selectivity ratios of Comparative Examples 6 and 7 are 2.2 and 1.4, respectively, which are as low as the other comparative examples. On the contrary, all Examples 1 to 24 have high selectivity ratios. Even Example 16 having the lowest selectivity ratio exhibits 7.6. The selectivity ratios of 7.6 or higher can respond to the recent demand for throughput improvement. In addition, Examples 1 to 24 and Comparative Examples 1 to 7 show similar tendencies in the selectivity ratios for the P-TEOS films and P-SiN films.

The removability of natural oxide films and damaged silicon layers will be evaluated below. All Examples 1 to 24 have good removability of the natural oxide films and damaged silicon layers. This means that the use of the etchant composition of the invention as a pretreatment liquid to perform anisotropic etching on monocrystalline silicon can improve throughput of the semiconductor device fabrication. On the contrary, Comparative Examples 2, 6 and 7 result in poor removability of the natural oxide films and damaged silicon layers.

Evaluation of resist damaging will be described below. Examples 9, 10, 15 and 21 exhibit good resist damage evaluation, in other words, the etching solutions of those examples cause no damage to the resist layers. These examples contain lactic acid as an organic acid. Therefore, etching solution used to etch a substrate with a resist formed thereon should be formulated based on the composition of these examples in terms of the resist damage.

The etching solutions including a surfactant, i.e., the etching solutions of Examples 22 to 24 including hydrofluoric acid, ammonium fluoride, acetic acid, organic acid, a surfactant and water have roughly the same properties as the etching solutions of Examples 1 to 21 without the surfactant. Therefore, the etching solutions with a surfactant can be effectively used when the wettability of the surface of an object to be etched is not high. For example, when a significantly fine device pattern hinders etching solution from penetrating small gaps in the pattern and therefore retards the etching process, the use of such an etchant composition system including a surfactant can improve the wettability, thereby proceeding etching while maintaining basic properties of the etching solution.

The foregoing has described the embodiment of the present invention by referring to the drawings. However, the invention should not be limited to the illustrated embodiment. It should be appreciated that various modifications and changes can be made to the illustrated embodiment within the scope of the appended claims and their equivalents.

INDUSTRIAL APPLICABILITY

The etchant composition and etching method according to the present invention are effectively used in order to efficiently fabricate semiconductor devices.

REFERENCE SIGNS LIST

11 target substrate
12 silicon substrate
13, 15 surface
14, 18*a*, 18*b* insulating film
16*a*, 16*b* metal film
17 opening

The invention claimed is:

1. An etchant composition used to etch a silicon-containing film formed on a target substrate, said composition comprising:
at least one additive selected from the group consisting of an organic compound containing a hydroxyl group, an organic compound containing a carbonyl group, an inorganic acid and inorganic salt, hydrofluoric acid, ammonium fluoride, and an organic acid;
wherein the etchant composition has a property to prevent corrosion of aluminum films and aluminum alloy films;
wherein a concentration of the hydrofluoric acid in an entire etching solution ranges from 0.5 weight % to 15 weight %, a concentration of the ammonium fluoride in the entire etching solution ranges from 5 weight % to 30 weight %, a concentration of the organic acid in the entire etching solution ranges from 5 weight % to 70 weight %, and a concentration of additives in the entire etching solution ranges from 1 weight % to 70 weight %.

2. The etchant composition according to claim 1 further comprising a surfactant.

3. The etchant composition according to claim 2, wherein the surfactant includes at least one additive selected from the group consisting of an amphoteric surfactant, an anionic surfactant and a nonionic surfactant.

4. The etchant composition according to claim 1, wherein the organic acid includes at least one additive selected from the group consisting of monocarboxylic acid, polycarboxylic acid, oxycarboxylic acid, phosphonic acid and sulfonic acid.

5. The etchant composition according to claim 1, wherein the organic acid includes at least one additive selected from the group consisting of acetic acid, propionic acid, oxalic acid, malonic acid, succinic acid, glutaric acid, glycolic acid, lactic acid, malic acid, tartaric acid, citric acid, amino tris(methylenephosphonic acid), 1-hydroxyethylidene-1,1-diphosphonic acid, methane sulfonic acid and ethane sulfonic acid.

6. The etchant composition according to claim 1, wherein the organic compound containing a hydroxyl group includes at least one additive selected from the group consisting of alcohols, glycols, triols and methylols.

7. The etchant composition according to claim 1, wherein the organic compound containing a hydroxyl group includes at least one additive selected from the group consisting of furfuryl alcohol, propylene glycol, polyethylene glycol, 1,4-butanediol, 3-methyl-1,3-butanediol, 1,6-hexanediol, 1,8-octanediol, 1,3-cyclohexanediol, 1,4-cyclohexanediol, 1,2,4-butanetriol, 3-methylpentane-1,3,5-triol and 1,4-cyclohexanedimethanol.

8. The etchant composition according to claim 1, wherein the organic compound containing a carbonyl group includes at least one additive selected from the group consisting of ketones, aldehydes and esters.

9. The etchant composition according to claim 1, wherein the organic compound containing a carbonyl group includes at least one additive selected from the group consisting of cyclopentanone and cyclohexanone.

10. The etchant composition according to claim 1, wherein the inorganic acid includes at least one additive selected from the group consisting of nitric acid, sulfuric acid and sulfamic acid.

11. The etchant composition according to claim 1, wherein the inorganic salt includes at least one additive selected from the group consisting of ammonium nitrate, ammonium sulfate and ammonium sulfamate.

12. An etching method comprising:
applying the composition of claim 1.

* * * * *